US011090683B2

(12) United States Patent
Seamons et al.

(10) Patent No.: US 11,090,683 B2
(45) Date of Patent: Aug. 17, 2021

(54) CURE METHOD FOR CROSS-LINKING SI-HYDROXYL BONDS

(71) Applicant: Applied Materials, Inc., Santa Clara, CA (US)

(72) Inventors: Martin Jay Seamons, San Jose, CA (US); Byung Kook Ahn, Gyeonggi-do (KR); Jingmei Liang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/692,841

(22) Filed: Nov. 22, 2019

(65) Prior Publication Data

US 2020/0171536 A1     Jun. 4, 2020

Related U.S. Application Data

(60) Provisional application No. 62/796,899, filed on Jan. 25, 2019, provisional application No. 62/775,008, filed on Dec. 4, 2018.

(51) Int. Cl.
*B05D 1/00* (2006.01)
*B05D 3/06* (2006.01)
*C23C 16/56* (2006.01)

(52) U.S. Cl.
CPC .............. *B05D 1/60* (2013.01); *B05D 3/067* (2013.01); *C23C 16/56* (2013.01)

(58) Field of Classification Search
CPC ............ B05D 1/60; B05D 3/067; C23C 16/56
See application file for complete search history.

(56) References Cited

U.S. PATENT DOCUMENTS 5,614,256 A * 3/1997 Wierer ................. C09D 127/06
                                                    427/244
7,097,886 B2 * 8/2006 Moghadam ........... C23C 16/045
                                                    257/E21.279

(Continued)

FOREIGN PATENT DOCUMENTS

KR      20090002973 A      1/2009
WO      2018020320 A1      2/2018

OTHER PUBLICATIONS

International Search Report and Written Opinion dated Mar. 17, 2020 for Application No. PCT/US2019/062833.

*Primary Examiner* — Dah-Wei D. Yuan
*Assistant Examiner* — Kristen A Dagenais-Englehart
(74) *Attorney, Agent, or Firm* — Patterson + Sheridan, LLP (57) ABSTRACT

Embodiments described herein provide a method of forming a silicon-and-oxygen-containing layer having covalent Si—O—Si bonds by cross-linking terminal silanol groups. The method includes positioning a substrate in a chamber. The substrate has one or more trenches including a width of 10 nanometers (nm) or less, and an aspect ratio of 2:1 or greater. The aspect ratio is defined by a ratio of a depth to the width of the one or more trenches. A silicon-and-oxygen-containing layer is disposed over the one or more trenches. The silicon-and-oxygen-containing layer has terminal silanol groups. The substrate is heated, and the silicon-and-oxygen-containing layer is exposed to an ammonia or amine group-containing precursor distributed across a process volume.

21 Claims, 7 Drawing Sheets

(56) References Cited

U.S. PATENT DOCUMENTS

| | | | |
|---|---|---|---|
| 7,524,735 B1* | 4/2009 | Gauri | H01L 21/31 438/436 |
| 8,557,712 B1 | 10/2013 | Antonelli et al. | |
| 2006/0027803 A1* | 2/2006 | Lu | H01L 21/02126 257/59 |
| 2006/0178019 A1* | 8/2006 | Senzaki | H01L 21/3145 438/788 |
| 2008/0026597 A1 | 1/2008 | Munro et al. | |
| 2010/0273382 A1* | 10/2010 | Nandi | C09D 5/18 442/76 |
| 2015/0111396 A1* | 4/2015 | Chan | C23C 16/401 438/798 |
| 2017/0137943 A1* | 5/2017 | Mohn | H01L 21/67115 |

\* cited by examiner

CURE METHOD FOR CROSS-LINKING SI-HYDROXYL BONDS

CROSS-REFERENCE TO RELATED APPLICATIONS

This application claims priority to U.S. Application No. 62/775,008, filed on Dec. 4, 2018 and U.S. Application No. 62/796,899, filed on Jan. 25, 2019, which are incorporated herein by reference in their entirety.

BACKGROUND

Field

Embodiments of the present disclosure generally relate to manufacturing semiconductor devices. More particularly, embodiments of the present disclosure relate to a method of forming a silicon-and-oxygen-containing layer.

Description of the Related Art

In semiconductor manufacturing, various features may be formed. Such features include trenches having high aspect ratios. For many semiconductor device manufacturing processes, there is a need to fill the trenches by depositing a silicon-and-oxygen-containing layer in the trenches. The layer may be deposited by one of flowable chemical vapor deposition (FCVD), plasma-enhanced chemical vapor deposition (PECVD), high-density plasma chemical vapor deposition (HDP-CVD), ozone-based CVD, thermal CVD, or other processes. The deposited silicon-and-oxygen-containing layer includes terminal silanol (Si—OH) groups resulting in a high wet etch rate and a high leakage current. Conventionally, to lower the wet etch rate and leakage current, the silicon-and-oxygen-containing layer is exposed to UV radiation to form covalent Si—O—Si bonds by cross-linking the terminal Si—OH groups. However, it is difficult for UV radiation to reach terminal Si—OH groups near the bottom of the high aspect ratio trenches. Therefore, there is a need for a method of forming a silicon-and-oxygen-containing layer having covalent Si—O—Si bonds that can provide for cross-linking terminal Si—OH groups at high aspect ratios.

SUMMARY

In one or more embodiments, a method is provided and includes positioning a substrate in a chamber, where the substrate has one or more trenches with a width of 10 nanometers (nm) or less and an aspect ratio of 2:1 or greater. The aspect ratio is defined by a ratio of a depth to the width of the one or more trenches. A silicon-and-oxygen-containing layer is disposed in the one or more trenches and the silicon-and-oxygen-containing layer has terminal silanol (Si—OH) groups. The method also includes heating the substrate to a temperature of about 100° C. to about 1000° C. and exposing the silicon-and-oxygen-containing layer to an ammonia or amine group-containing precursor distributed across a process volume of the chamber.

In other embodiments, a method is provided. The method includes positioning a substrate in a chamber. The substrate has one or more trenches with a width of 10 nanometers (nm) or less and an aspect ratio of 2:1 or greater. The aspect ratio is defined by a ratio of a depth to the width of the one or more trenches. The method further includes depositing a silicon-and-oxygen-containing layer over the one or more trenches, heating the substrate to a temperature of about 10° C. to about 150° C., and exposing the silicon-and-oxygen-containing layer to an ammonia or amine group-containing precursor distributed across a process volume of the chamber. The silicon-and-oxygen-containing layer has terminal silanol (Si—OH) groups.

In some embodiments, a method is provided. The method includes positioning a substrate in a first chamber. The substrate has one or more trenches with a width of 10 nanometers (nm) or less and an aspect ratio of 5:1 or greater. The aspect ratio defined by a ratio of a height to the width of the one or more trenches. A silicon-and-oxygen-containing is deposited. The depositing the silicon-and-oxygen-containing layer includes providing oxygen radicals and a silicon-containing precursor to a process volume of the first chamber. The oxygen radicals polymerize [O—Si—(CH3)$_x$]$_y$ chains to deposit the silicon-and-oxygen-containing layer over the one or more trenches with terminal silanol (Si—OH) groups. The method further includes removing the substrate from the first chamber and positioning the substrate in a second chamber, heating the substrate to a temperature of about 100° C. to about 1000° C., and exposing the silicon-and-oxygen-containing layer to an ammonia or amine group-containing precursor distributed across a process volume.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein provide a method of forming a silicon-and-oxygen-containing layer having covalent Si—O—Si bonds by cross-linking terminal silanol (Si—OH) groups. The method includes positioning a substrate in a chamber. The substrate has one or more trenches with a width of 10 nanometers (nm) or less and an aspect ratio of 2:1 or greater. The aspect ratio is defined by a ratio of a depth to the width of the one or more trenches. A silicon-and-oxygen-containing layer is disposed in the one or more trenches. The silicon-and-oxygen-containing layer has terminal silanol (Si—OH) groups. The substrate is heated and the silicon-and-oxygen-containing layer is exposed to an ammonia or amine group-containing precursor distributed across a process volume.

Figure 1:
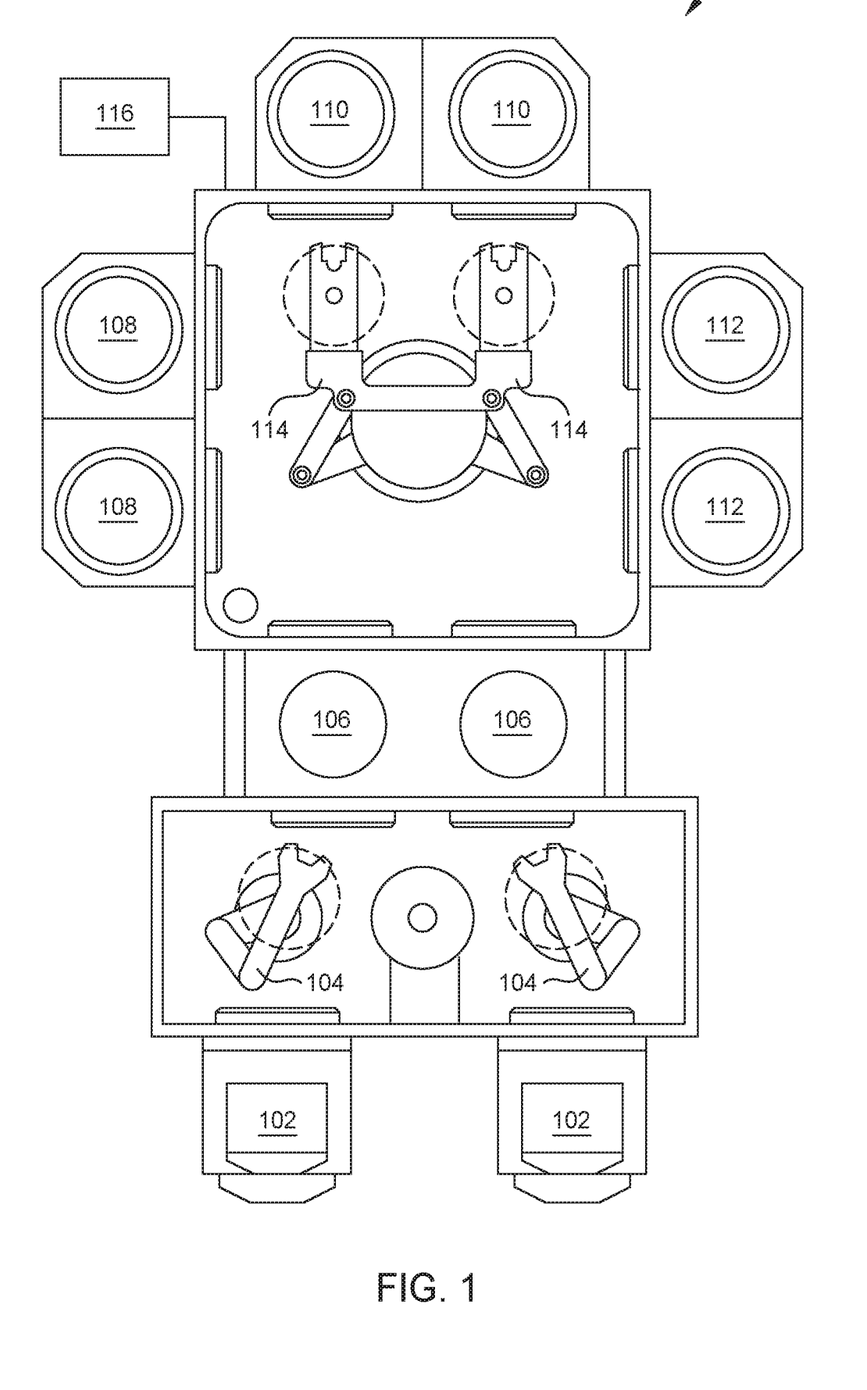
FIG. 1 is a schematic view of a system, according to one or more embodiments described and discussed herein.

FIG. 1 is a schematic view of a system 100 utilized for the method of forming a silicon-and-oxygen-containing layer having covalent Si—O—Si bonds by cross-linking terminal Si—OH groups described herein. As shown in FIG. 1, a pair of front opening unified pods (FOUPs) 102 supplies substrates that are received by robotic arms 104 and placed into a holding area 106 before being placed into one of the deposition chambers 108, thermal curing chambers 110, and ultraviolet (UV) curing chambers 112. A second robotic arm 114 may be used to transport the substrates from the holding area 106 to and between the deposition chambers 108, thermal curing chambers 110, and UV curing chambers 112. The deposition chambers 108 are utilized to deposit a silicon-and-oxygen-containing layer having terminal Si—OH groups deposited over one or more features of a substrate to fill the one or more features.

According to embodiments described herein, which can be combined with other embodiments described herein, the deposition chambers 108 are also utilized for thermal catalytic curing the silicon-and-oxygen-containing layer to cross-link, e.g., catalyze or polymerize, the terminal Si—OH groups to Si—O—Si and $H_2O$. The thermal curing chambers 110 may additionally be utilized for thermal catalytic curing the silicon-and-oxygen-containing layer. The UV curing chambers 112 are utilized for optional, additional, UV curing of the silicon-and-oxygen-containing layer to cross-link the terminal Si—OH groups to Si—O—Si and $H_2O$. A system controller 116 is coupled to the system 100 and controls each of the deposition chambers 108, thermal curing chambers 110, and UV curing chambers 112 of the system 100 to perform the method of forming a silicon-and-oxygen-containing layer having Si—O—Si bonds (for example, covalent bonds) by cross-linking terminal Si—OH groups described herein. Furthermore, the system controller 116 is interfaced with a controller 226 (shown in FIG. 2) of the deposition chamber 108. While system 100 is shown for purposes of explanation, it is contemplated that other systems may be utilized in accordance with disclosure. It is contemplated, in some embodiments, which may be combined with other embodiments, that both deposition and curing occur in deposition chambers 108. In such examples, the thermal curing chambers 110 and UV curing chambers 112 may be omitted. In other embodiments, which may be combined with other embodiments, that deposition of material occurs in the deposition chamber 108 and that curing of material occurs in the thermal curing chambers 110. In such embodiments, the UV curing chambers 112 may be optionally omitted.

Figure 2:
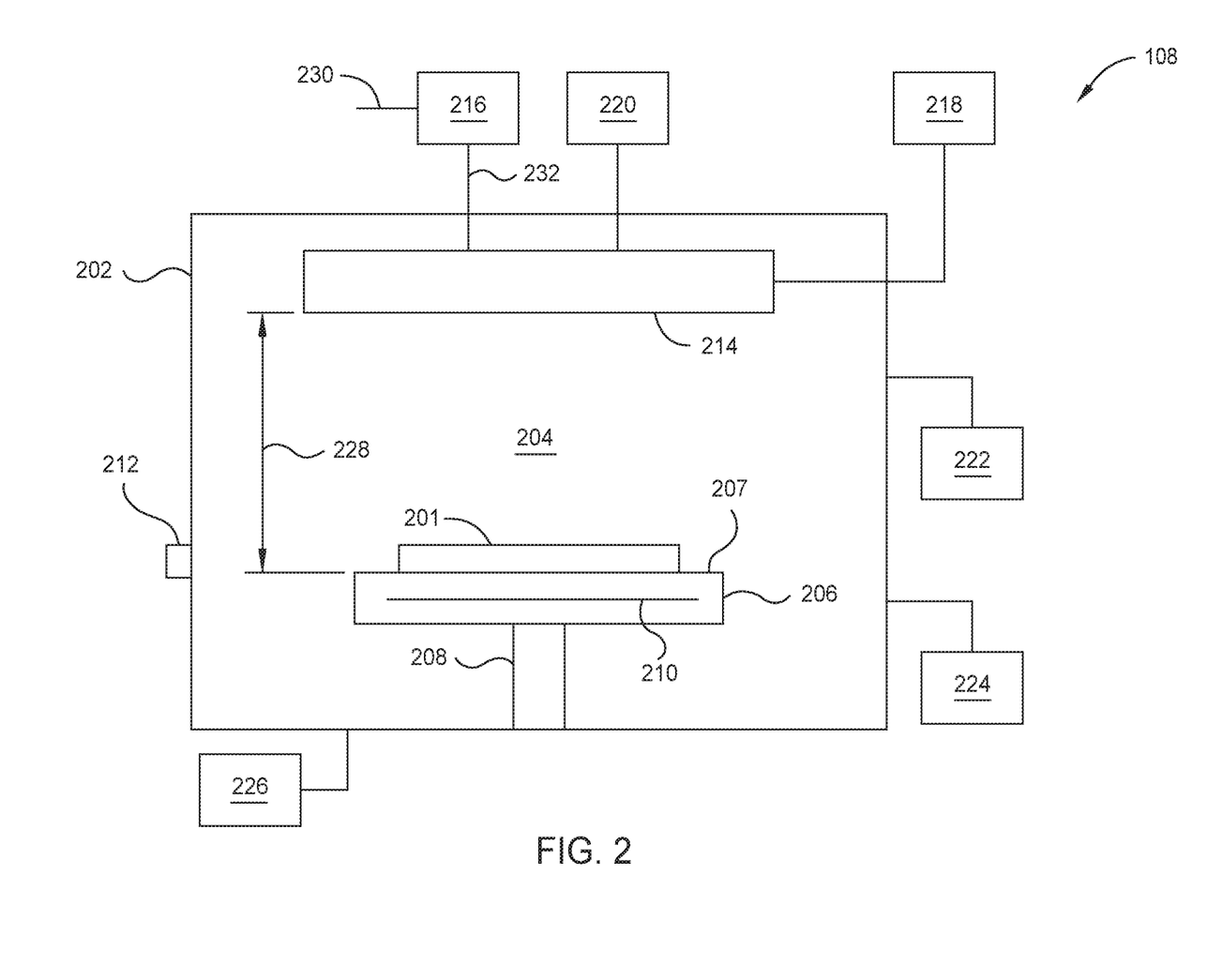
FIG. 2 is a schematic view of a deposition chamber, according to one or more embodiments described and discussed herein.

FIG. 2 is a schematic view of a deposition chamber 108 containing a chamber body 202. The chamber body 202 includes a process volume 204 having a substrate support 206 disposed therein to support a substrate 201. The substrate support 206 includes a heating element 210 and a mechanism (not shown) that retains the substrate 201 on a top surface 207 of the substrate support 206, such as an electrostatic chuck, a vacuum chuck, a substrate retaining clamp, or the like. In one or more embodiments described herein, which can be combined with other embodiments described herein, the heating element 210 is a fluid channel that is coupled to a heat exchanger. In some embodiments described herein, which can be combined with other embodiments described herein, the heating element 210 is a resistive heater element. The substrate support 206 is coupled to and movably disposed in the process volume 204 by a stem 208 connected to a lift system (not shown) that moves the substrate support 206 between an elevated processing position and a lowered position that facilitates transfer of the substrate 201 to and from the system 100 through an opening 212. The elevated processing position is a process distance 228 between the top surface 207 and a showerhead 214.

The deposition chamber 108 includes a radical source 216, a silicon-containing precursor source 218, and an ammonia or amine group-containing precursor source 220 coupled to the showerhead 214 used for distributing the process gasses across the process volume 204. The radical source 216 may be any suitable source that is capable of generating radicals. The radical source 216 may be a remote plasma source, such as a radio frequency (RF) or very high radio frequency (VHRF) capacitively coupled plasma (CCP) source, an inductively coupled plasma (ICP) source, a microwave induced (MW) plasma source, an electron cyclotron resonance (ECR) chamber, or a high density plasma (HDP) chamber. Alternatively, the radical source 216 may be an ultraviolet (UV) source or the filament of a hot wire chemical vapor deposition (HW-CVD) chamber. The radical source 216 may include one or more gas inlets 230, and the radical source 216 may be coupled to the showerhead 214 by a radical conduit 232. One or more radical-forming gases may enter the radical source 216 via the one or more gas inlets 230. The one or more process gases include at least one of an oxygen-containing gas, a nitrogen-containing gas, and a hydrogen containing gas. Radicals generated in the radical source 216 travel into the showerhead 214 through the radical conduit 232. While the radical source 216, the ammonia or amine group-containing precursor source 220, and the silicon-containing precursor source 218 are illustrated as coupled to the showerhead 214 through separate conduits, it is contemplated that one or more common conduits may be utilized. Additionally, in situ (e.g., within the process volume 204) generation of radicals and/or plasma is contemplated to facilitate operations disclosed herein.

The silicon-containing precursor source 218 may be configured to provide a fluid mixture of at least one carrier gas and at least one silicon-containing precursor. The carrier gas includes at least one of argon (Ar) and helium (He). The silicon-containing precursor includes silicon-containing compounds, such as organo-silanes, or compounds that include that contains one or more of Si—C bonds and/or Si—O bonds. The silicon-containing precursor may include one or more of siloxanes, carbo-silanes, octamethylcyclotetrasiloxane (OMCTS), tetramethylcyclotetrasiloxane (TMCTS), octadecyltrichlorosilane (OTS), hexamethyldisiloxane (HMDSO), tetramethyldisiloxane (TMDSO), tetraethoxysilane (TEOS), bis(trimethylsilyl)methane (BTMSM), methylenebis(dimethylsilane) ($C_5H_{16}Si_2$), methylenebis(methylsilane) ($C_3H_{12}Si_2$), methylenedisilane ($CH_8Si_2$), silane ($SiH_4$), disilane ($Si_2H_6$), trisilylamine (($H_3Si)_3N$), or any combination thereof. A silicon-and-oxygen-containing layer having terminal Si—OH groups is deposited on the substrate 201 by using the radicals in the process volume 204 to polymerize alkylsiloxane chains. In some examples, the alkylsiloxane chains can be or include polydimethylsiloxane terminated or capped with a trimethylsilyl group and/or a hydroxyl group. In one or more examples, the alkylsiloxane chains can have the chemical formula of $[-OSi(CH_3)_x-]_y$, where X is 1, 2, or 3, for example 2, and Y is an integer from 2 to about 100, about 200, or about 500, for example from 2 to about 20. The alkylsiloxane chains can be linear or branched and can be terminated or capped with a trimethylsilyl group and/or a hydroxyl group. In one or more embodiments, which can be combined with other embodiments described herein, the alkylsiloxane chains of the silicon-containing precursor are polymerized. In other embodiments, which can be combined with other embodiments described herein, the alkylsiloxane chains are formed from the silicon-containing precursor and oxygen radicals. An inert gas source 222 is coupled to the chamber body 202. The inert gas source 222 is operable to provide inert gas to the process volume 204 to pressurize the process volume 204, to facilitate precursor gas flow, to purge the process volume 204, and the like. It is contemplated that the inert gas source 222 may share a common input with one or more of the silicon-containing precursor source 218, the radical source 216, and/or the ammonia or amine group-containing precursor source 220. A pump 224 is coupled to the chamber body 202 for controlling the pressure within the process volume 204.

Figure 3A:
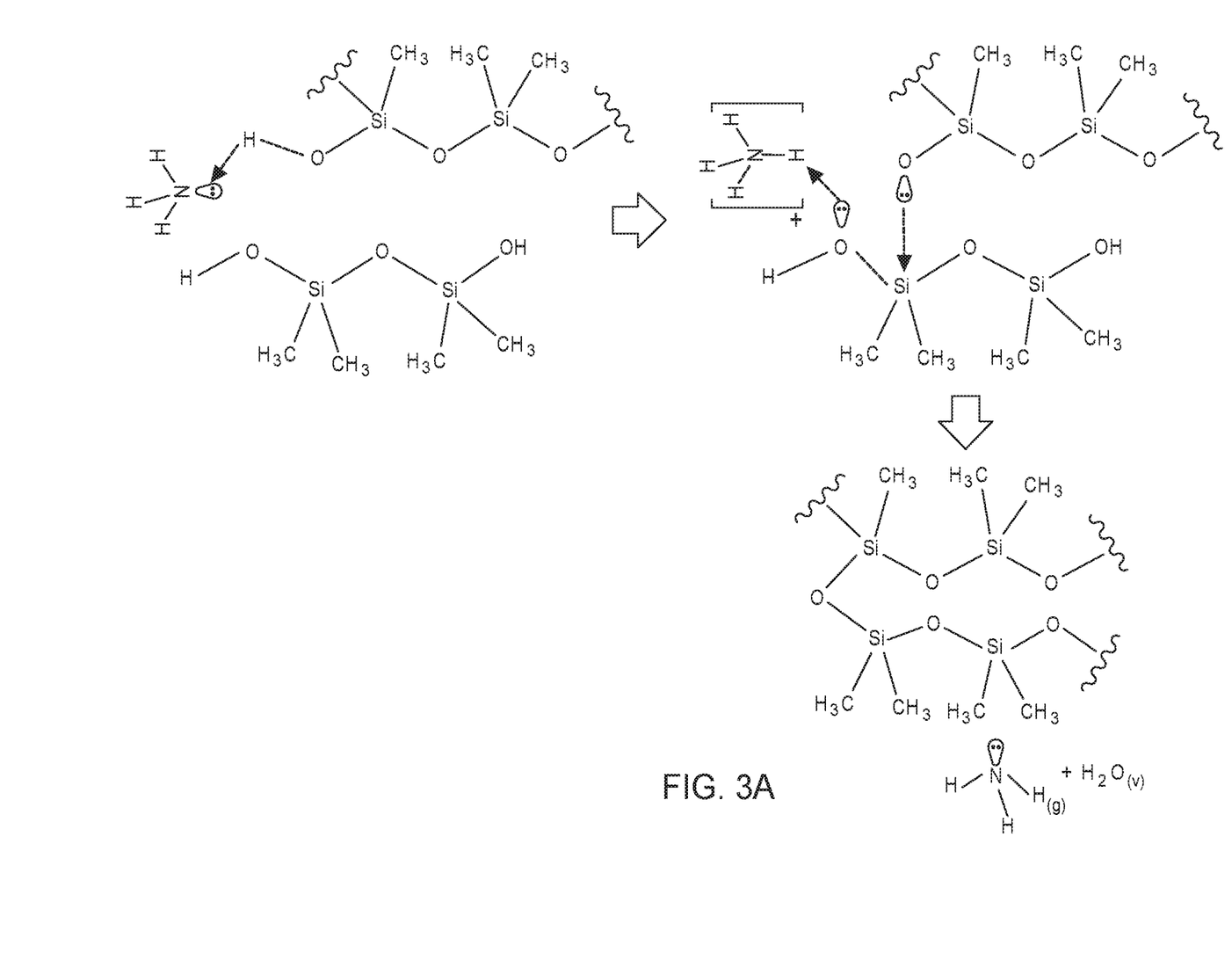
FIGS. 3A and 3B are schematic illustrations of a thermal catalytic curing process, according to one or more embodiments described and discussed herein.

The ammonia or amine group-containing precursor source 220 includes an ammonia or amine group-containing precursor. The ammonia or amine group of the ammonia or amine group-containing precursor can include at least one of ammonia ($NH_3$) and amines having a lone pair to interact with the terminal Si—OH groups. The ammonia or amine group-containing precursor may be or include one or more of $NH_3$, methylamine ($CH_5N$), dimethylamine ($C_2H_7N$), trimethylamine ($C_3H_9N$), ethylamine ($C_2H_7N$), diethylamine (($CH_3CH_2)_2NH$), triethylamine ($N(CH_2CH_3)_3$), or any combination thereof. After the silicon-and-oxygen-containing layer having terminal Si—OH groups is deposited, the ammonia or amine group-containing precursor is provided to the showerhead 214 and distributed across the process volume 204 to expose the substrate 201 to the ammonia or amine group-containing precursor. The substrate support 206 in the process volume 204 is maintained at a temperature of about 10° C. to about 1000° C. by the heating element 210 when the ammonia or amine group-containing precursor is distributed across the process volume 204. For example, the substrate support 206 is maintained at a temperature of about 100° C. to about 750° C., such as about 100° C. to about 500° C., about 150° C. to about 500° C., or about 100° C. to about 150° C. As shown in FIG. 3A, the ammonia or amine group, such as $NH_3$, of the ammonia or amine group-containing precursor has one or more electronegative lone pairs that attract hydroxyl groups of Si—OH and form Si—O—Si bonds with adjacent Si—OH groups, producing $H_2O$ vapor as a byproduct. A controller 226 is coupled to and controls the deposition chamber 108 to perform the method of forming a silicon-and-oxygen-containing layer having covalent Si—O—Si bonds by cross-linking terminal Si—OH groups described herein.

Figure 4:
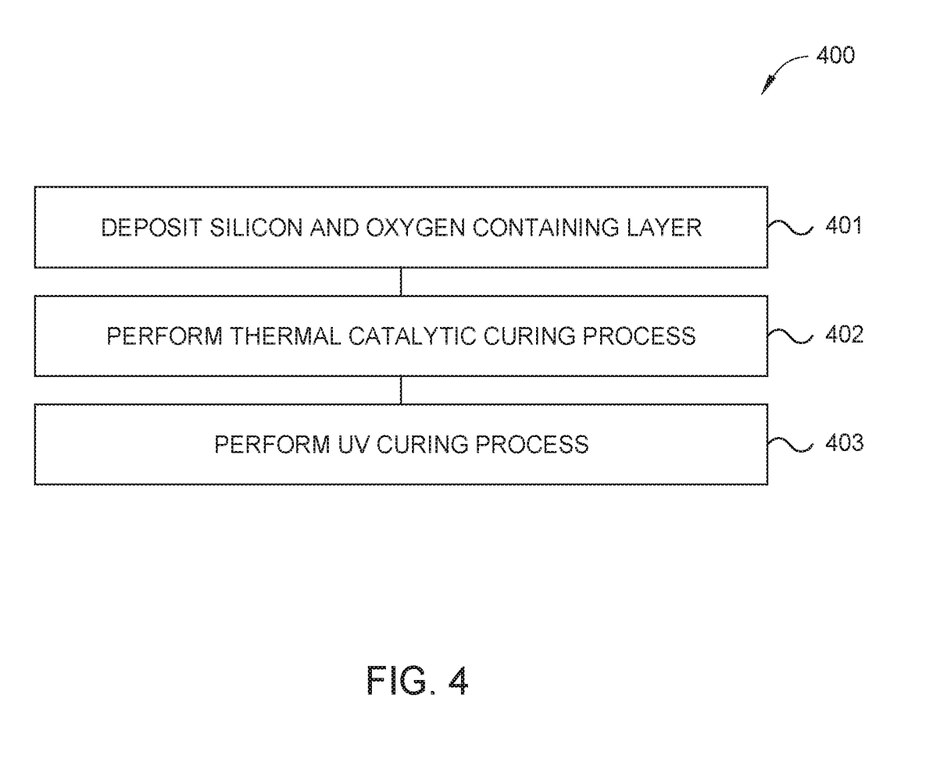
FIG. 4 is a flow diagram of a method of forming a silicon-and-oxygen-containing layer, according to one or more embodiments described and discussed herein.
Figure 5A:
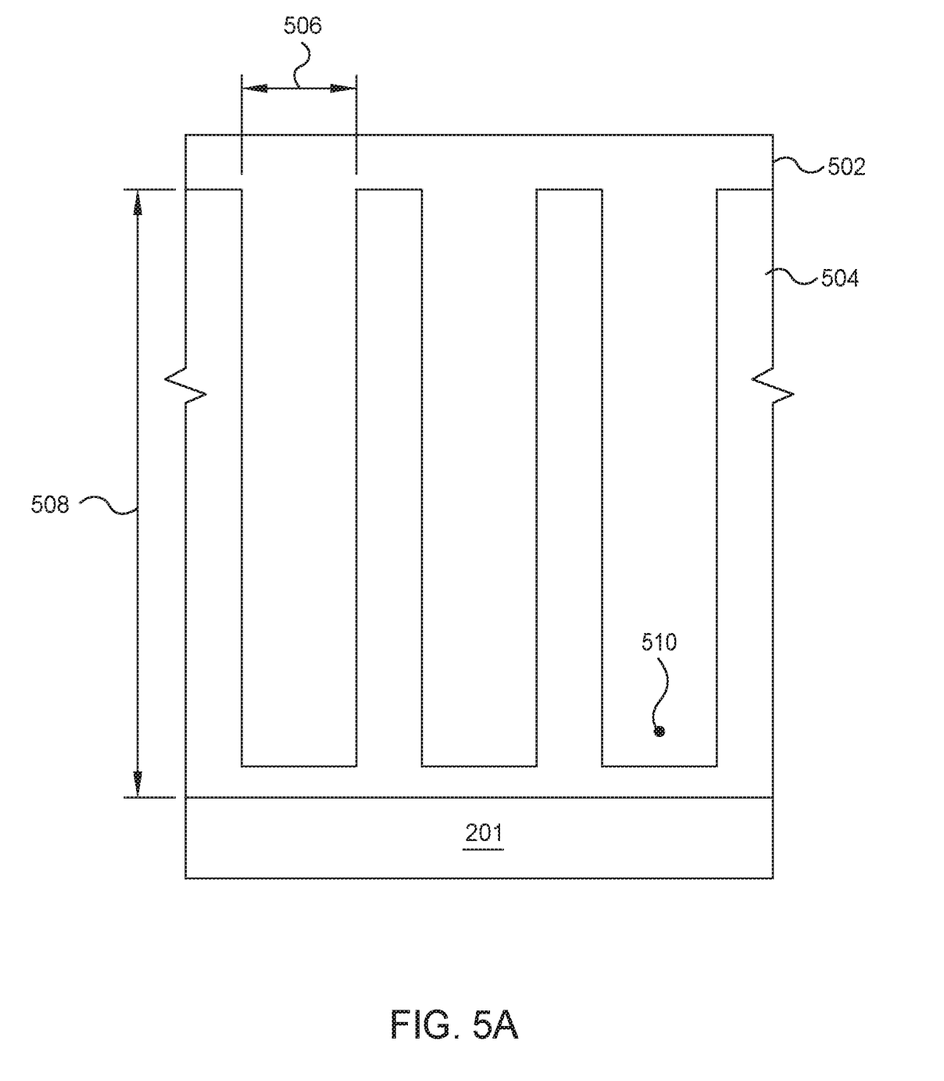
FIGS. 5A and 5B are schematic views of a substrate during operations of a method of forming a silicon-and-oxygen-containing layer, according to one or more embodiments described and discussed herein.
Figure 5B:
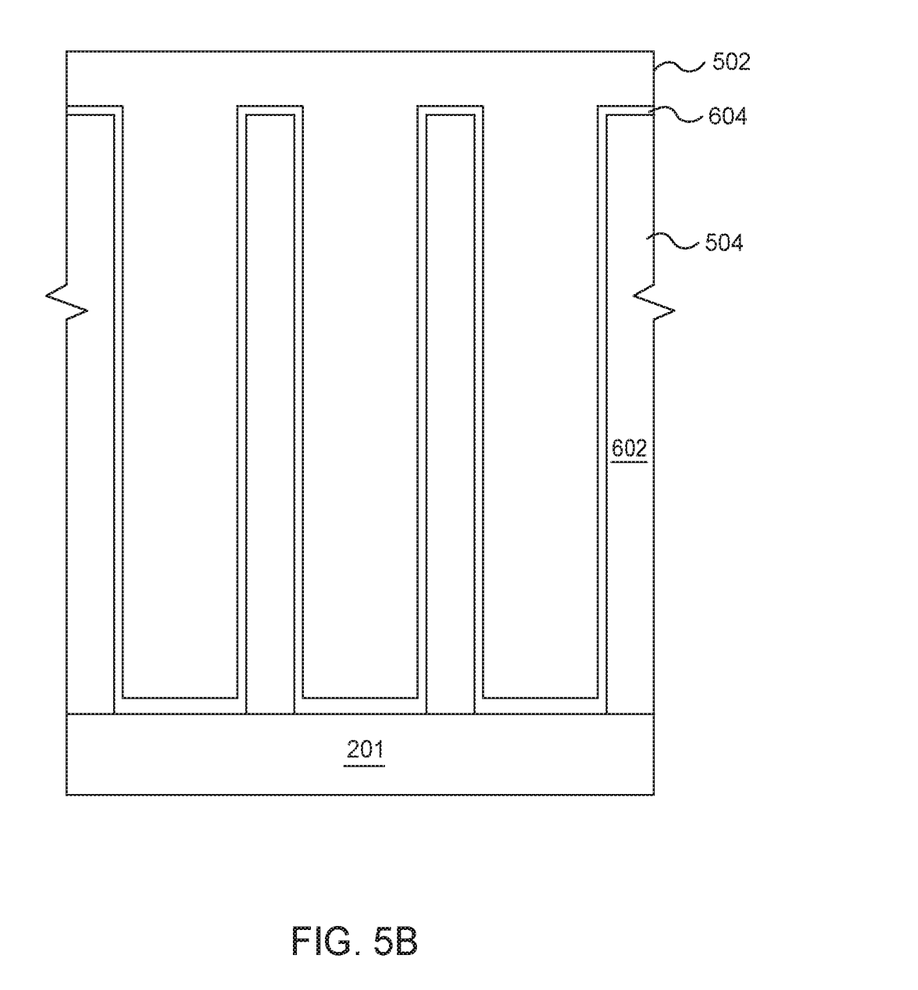

FIG. 4 is a flow diagram of a method 400 of forming a silicon-and-oxygen-containing layer having covalent Si—O—Si bonds by cross-linking terminal Si—OH groups. To facilitate explanation, FIG. 4 will be described with reference to FIGS. 1, 2, 5A, and 5B. However, it is to be noted that a system other than the system 100 of FIG. 1 and a deposition chamber other than the deposition chamber 108 of FIGS. 1 and 2 may be utilized in conjunction with the method 400. FIGS. 5A and 5B are schematic views of a substrate 201 during operations of the method 400.

At operation 401, a silicon-and-oxygen-containing layer 502 is deposited over one or more features 504 (shown as three high aspect ratio trenches) of a substrate 201 to fill the one or more features 504. During operation, the substrate 201 is located in the deposition chamber 108 and positioned on the top surface 207 of the substrate support 206. During operation 401, a top surface 207 is positioned a process distance 228 from the showerhead 214. The process distance 228 during operation 401 is about 0.5 inches to about 5 inches, such as about 2.0 inches to about 3.0 inches. However, other distances are also contemplated.

An oxygen-containing gas, such as oxygen gas ($O_2$) is provided to the radical source 216 from a gas supply (not shown) via the one or more gas inlets 230. Oxygen radicals generated in the radical source 216 travel into the showerhead 214 and are introduced to the process volume 204. In one or more embodiments, the radical source 216 may comprise a plasma source such as inductively coupled plasma (ICP) or capacitively coupled plasma (CCP). The oxygen radicals are provided to the process volume 204 at a flow rate of about 100 sccm to about 5000 sccm. The silicon-containing precursor source 218 introduces the fluid mixture of a carrier gas and a silicon-containing precursor into the showerhead 214 and the fluid mixture is introduced to the process volume 204. In one or more embodiments described herein, which can be combined with other embodiments described herein, the fluid mixture includes OMCTS and one or more of Ar and He. Argon is provided to the process volume 204 at a flow rate of about 0.2 SLM to about 5 SLM, such as about 0.6 SLM to about 1.5 SLM. OMCTS is provided to the process volume 204 at a flow rate of about 0.3 grams per minute (g/min) to about 5 g/min, such as about 1 g/min to about 2 g/min. A silicon-and-oxygen-containing layer having terminal Si—OH groups is deposited on the substrate 201 by using the radicals in the process volume 204 to polymerize alkylsiloxane chains.

At operation 402, a thermal catalytic curing process is performed. The stem 208 moves the substrate support 206 to an elevated processing position, if not already in an elevated processing position. The elevated processing position defines a process distance 228 between the top surface 207 and a showerhead 214. The process distance 228 during operation 402 is about 0.25 inches to about 5 inches, such as about 2 inches to about 3 inches. Other process distances 228 are also contemplated. The ammonia or amine group-containing precursor source 220 introduces ammonia and/or one or more amine group-containing precursors into the showerhead 214, and the fluid mixture is introduced to the process volume 204. In one or more embodiments described herein, which can be combined with other embodiments described herein, ammonia is provided or otherwise introduced to the process volume 204 at a flow rate of about 0.1 SLM to about 5 SLM, such as 0.9 SLM. The process volume 204 is maintained at a pressure of about 0.5 Torr to 50 Torr, such as about 1 Torr and 20 Torr. The inert gas source 222 provides inert gas, such as Ar, to the process volume 204 to pressurization of the process volume 204. The inert gas is provided at a flow rate of about 1 SLM to about 10 SLM, such as about 1 SLM to about 2 SLM. The substrate 201 is maintained at a temperature of about 10° C. to about 150° C., such as about 80° C., by the heating element 210 when the ammonia or amine group-containing precursor distributed across the process volume 204 for an exposure time of about 1 second to about 100 minutes, for example about 1 second to about 60 minutes, for example about 3 seconds to about 60 minutes. The silicon-and-oxygen-containing layer 502 is exposed to the ammonia or amine group-containing precursor distributed across the process volume 204. The ammonia or amine group-containing precursor cross-links, e.g., catalyzes or polymerizes, the terminal Si—OH groups to form Si—O—Si bonds (e.g., covalent bonds) and produces H$_2$O and nitrogen gas which are exhausted from the process volume.

Figure 3B:
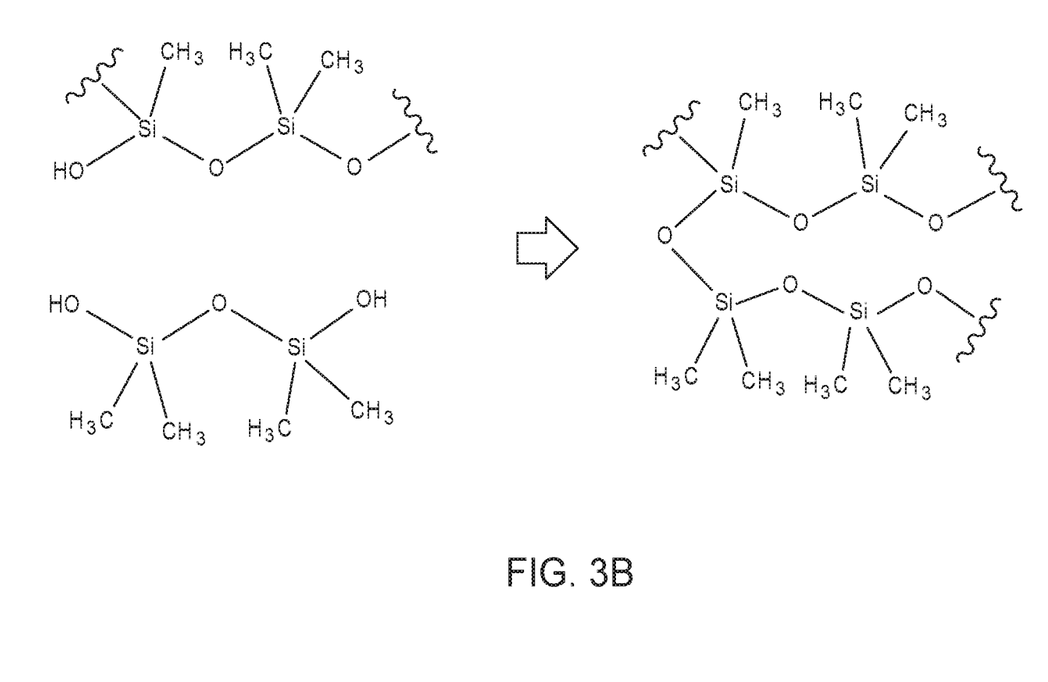

At optional operation 403, a UV curing process is performed. After operation 402, the stem 208 lowers the substrate support 206 to facilitate substrate removal, and the substrate 201 is transferred to one of the UV curing chambers 112 by the second robotic arm 114 of the system 100. In the UV curing chambers 112, UV radiation is projected to the silicon-and-oxygen-containing layer 502. In one or more embodiments, the duration of the UV curing process may range from about 30 seconds to about 30 minutes, for example about 5 minutes. The pressure in the UV curing chambers 112 may be from about 1 Torr to about 50 Torr, for example about 20 Torr. In one or more embodiments, the UV radiation source is a broad-band UV bulb that emits at wavelengths from about 250 nm to about 450 nm. As shown in FIG. 3B, the UV radiation cross-links remaining terminal Si—OH groups to form covalent Si—O—Si bonds and produce H$_2$O vapor.

Conventionally, the silicon-and-oxygen-containing layer 502 is UV cured without performing the thermal catalytic curing process. However, when the features 504 have a width 506 of 10 nanometers (nm) or less and an aspect ratio (depth 508:width 506) of about 2:1 or greater, such as about 5:1 or greater, UV curing is ineffective at crosslinking in lower portions of the trenches. For example, UV radiation generally does not reach terminal Si—OH groups at a point 510 of the high aspect ratio features 504. Additionally, according to embodiments, which can be combined with other embodiments described herein, as shown in FIG. 5B, the one or more features 504 include a layer containing silicon nitride disposed over a layer containing titanium nitride. In one or more examples, the layer containing silicon nitride can be or include Si$_3$N$_4$ and can be deposited, formed, or otherwise produced by an atomic layer deposition (ALD) process. Performing the UV curing process to cure the silicon-and-oxygen-containing layer 502 without performing the thermal catalytic curing process can cause shrinkage of the silicon-and-oxygen-containing layer 502 and delamination of the layer containing silicon nitride from the layer containing titanium nitride due to the limitations of the UV curing process. Limitations of the UV curing process include sensitivity to electromagnetic (EM) interference patterns and a limited penetration depth due to attenuation of the UV radiation.

The embodiments of the method 400 described herein form the silicon-and-oxygen-containing layer 502 having covalent Si—O—Si bonds by cross-linking terminal Si—OH groups. The silicon-and-oxygen-containing layer 502 formed by the method 400 has a wet etch rate of less than 8 Angstrom per minute (Å/min), such as less than 1 Å/min, a leakage current density of less than 1E-6 MV/cm (A/cm$^2$), such as less than 1E-9 MV/cm (A/cm$^2$), and shrinkage of less than 12%, such as less than 8%, less than 5%, less than 3%, less than 1%, or about 0% shrinkage. In some embodiments, the wet etch rate is about 0.001 Å/min.

In other embodiments, which can be combined with other embodiments described herein, the silicon-and-oxygen-containing layer 502 having covalent Si—O—Si bonds by cross-linking terminal Si—OH groups is deposited by one of plasma-enhanced chemical vapor deposition (PECVD), high-density plasma chemical vapor deposition (HPD-CVD), ozone-based CVD, and thermal CVD. The processes utilize precursors including one or more of siloxanes, carbosilanes, OMCTS, TMCTS, OTS, HMDSO, TMDSO, TEOS, BTMSM, C$_5$H$_{16}$Si$_2$, C$_3$H$_{12}$Si$_2$, CH$_8$Si$_2$, SiH$_4$, Si$_2$H$_6$, trisilylamine ((H$_3$Si)$_3$N), or any combination thereof. In other embodiments, which can be combined with other embodiments described herein, after operation 401 the stem 208 moves the substrate support 206 to a lowered position, and the substrate 201 is transferred to one of the thermal curing chambers 110 by the second robotic arm 114 of the system 100. The thermal curing chambers 110 include the chamber body 202, the substrate support 206, the opening 212, the showerhead 214, the inert gas source 222, the pump 224, and the ammonia or amine group-containing precursor source 220. In operation 402, a temperature of the substrate 201 is about 100° C. to about 1000° C., a pressure in the thermal curing chamber 110 is about 0.5 Torr to about 600 Torr, a flow rate of the ammonia or amine group-containing precursor is about 0.1 SLM to about 25 SLM, such as about 0.1 SLM to about 10 SLM, a process distance 228 is about 0.25 inches to about 5 inches, and inert gas is provided at a flow rate of about 1 SLM to about 25 SLM, such as about 2 SLM to about 5 SLM.

In summation, a method of forming a silicon-and-oxygen-containing layer having covalent Si—O—Si bonds by cross-linking terminal Si—OH groups is provided. The utilization of thermal catalytic curing allows for cross-linking the terminal Si—OH groups to Si—O—Si and releasing H$_2$O and nitrogen at aspect ratios where UV curing is ineffective. The utilization of thermal catalytic curing also allows for a reduction of shrinkage, a wet etch rate less than 8 Å/min, and a leakage current density less than 1E-6 MV/cm (A/cm$^2$).

While the foregoing is directed to examples of the present disclosure, other and further examples of the disclosure may be devised without departing from the basic scope thereof, and the scope thereof is determined by the claims that follow.

What is claimed is:

1. A method, comprising:
  disposing a silicon-and-oxygen-containing layer in one or more trenches on a substrate, the silicon-and-oxygen-containing layer having terminal silanol groups and the trench having:
    a width of 10 nanometers (nm) or less; and
    an aspect ratio of 2:1 or greater, the aspect ratio defined by a ratio of a depth to the width of the one or more trenches;
  transferring the substrate having the silicon-and-oxygen-containing layer thereon into a chamber;
  heating the substrate in the chamber; and
  exposing the silicon-and-oxygen-containing layer to an ammonia or amine group-containing catalyst distributed across a process volume of the chamber.

2. The method of claim 1, wherein positioning the substrate comprises:
  transferring the substrate to a substrate support of the chamber; and
  elevating the substrate support an elevated processing position to a process distance of about 0.25 inches to about 5 inches between the substrate support and a showerhead of the chamber.

3. The method of claim 1, wherein a pressure in the chamber is about 0.5 Torr to about 600 Torr.

4. The method of claim 1, wherein the ammonia or amine group-containing catalyst is introduced to the process volume at a flow rate of about 0.1 SLM to about 25 SLM.

5. The method of claim 1, wherein inert gas is introduced to the process volume at a flow rate of about 1 SLM to about 10 SLM.

6. The method of claim 1, wherein the ammonia or amine group-containing catalyst comprises ammonia.

7. The method of claim 1, further comprising transferring the substrate to an ultraviolet (UV) curing chamber and UV curing the silicon-and-oxygen-containing layer after exposing the silicon-and-oxygen-containing layer to the ammonia or amine group-containing catalyst.

8. A method, comprising:
positioning a substrate on a substrate support in a chamber, the substrate having:
one or more trenches comprising:
a width of 10 nanometers (nm) or less; and
an aspect ratio of 2:1 or greater, the aspect ratio defined by a ratio of a depth to the width of the one or more trenches;
depositing a silicon-and-oxygen-containing layer in the one or more trenches, the silicon-and-oxygen-containing layer having terminal silanol groups;
heating the substrate support with the substrate thereon to a temperature of about 10° C. to about 1000° C.; and
exposing the silicon-and-oxygen-containing layer to an ammonia or amine group-containing catalyst distributed across a process volume, the exposing comprising cross-linking adjacent terminal silanol groups to form a polymerized silicon-and-oxygen-containing layer.

9. The method of claim 8, wherein the depositing the silicon-and-oxygen-containing layer comprises:
introducing oxygen radicals and a silicon-containing precursor to the process volume of the chamber, the oxygen radicals polymerizing the silicon-containing precursor to deposit the silicon-and-oxygen-containing layer in the one or more trenches with the terminal silanol groups.

10. The method of claim 9, further comprising:
prior to the introducing the oxygen radicals and the silicon-containing precursor, elevating the substrate support a first process distance of about 0.5 inches to about 5 inches between the substrate support and a showerhead of the chamber; and
prior to the exposing the silicon-and-oxygen-containing layer to the ammonia or amine group-containing catalyst, elevating the substrate support a second process distance of about 0.25 inches to about 5 inches between the substrate support and the showerhead.

11. The method of claim 10, wherein the silicon-containing precursor comprises one or more of siloxanes, carbosilanes, octamethylcyclotetrasiloxane (OMCTS), tetramethylcyclotetrasiloxane (TMCTS), octadecyltrichlorosilane (OTS), hexamethyldisiloxane (HMDSO), tetramethyldisiloxane (TMDSO), tetraethoxysilane (TEOS), bis(trimethylsilyl)methane (BTMSM), methylenebis(dimethylsilane), methylenebis(methylsilane), methylenedisilane, silane, disilane, trisilylamine, or any combination thereof.

12. The method of claim 8, wherein a pressure in the chamber during the exposing the silicon-and-oxygen-containing layer to the ammonia or amine group-containing catalyst is about 0.5 Torr to about 50 Torr.

13. The method of claim 8, wherein the ammonia or amine group-containing catalyst is introduced to the process volume at a flow rate of about 0.1 SLM to about 25 SLM.

14. The method of claim 8, wherein inert gas is provided to the process volume at a flow rate of about 1 SLM to about 10 SLM.

15. The method of claim 8, wherein the ammonia or amine group-containing catalyst comprises one or more of ammonia, methylamine, dimethylamine, trimethylamine, ethylamine, diethylamine, triethylamine, or any combination thereof.

16. The method of claim 8, wherein the one or more trenches comprise a silicon nitride layer and a titanium layer disposed therein, and wherein the silicon-and-oxygen-containing layer is formed over the silicon nitride layer and the titanium layer.

17. The method of claim 8, further comprising transferring the substrate to an ultraviolet (UV) curing chamber and UV curing the silicon-and-oxygen-containing layer after exposing the silicon-and-oxygen-containing layer to the ammonia or amine group-containing catalyst.

18. A method, comprising:
positioning a substrate on a substrate support in a first chamber, the substrate having:
one or more trenches comprising:
a width of 10 nanometers (nm) or less; and
an aspect ratio of 2:1 or more, the aspect ratio defined by a ratio of a height to the width of the one or more trenches;
depositing a silicon-and-oxygen-containing layer, the depositing the silicon-and-oxygen-containing layer comprising:
introducing oxygen radicals and a silicon-containing precursor to a process volume of the first chamber, wherein the oxygen radicals and the silicon-containing precursor deposit the silicon-and-oxygen-containing layer over the one or more trenches with terminal silanol groups;
removing the substrate from the first chamber and positioning the substrate in a second chamber;
heating the substrate support with the substrate thereon to a temperature of about 10° C. to about 1000° C.;
exposing the silicon-and-oxygen-containing layer to an ammonia or amine group-containing catalyst distributed across a process volume, the exposing comprising cross-linking adjacent terminal silanol groups to form a polymerized silicon-and-oxygen-containing layer, the forming the polymerized silicon-and-oxygen-containing layer generating $H_2O$; and
exhausting the $H_2O$ from the chamber.

19. The method of claim 18, wherein the ammonia or amine group-containing catalyst comprises one or more of ammonia, methylamine, dimethylamine, trimethylamine, ethylamine, diethylamine, triethylamine, or any combination thereof.

20. The method of claim 18, further comprising transferring the substrate to an ultraviolet (UV) curing chamber and UV curing the silicon-and-oxygen-containing layer after exposing the silicon-and-oxygen-containing layer to the ammonia or amine group-containing catalyst.

21. The method of claim 1, wherein the exposing comprises cross-linking adjacent terminal silanol groups to form a polymerized silicon-and-oxygen-containing layer.

* * * * *